(12) United States Patent
Yoel

(10) Patent No.: US 8,142,965 B2
(45) Date of Patent: Mar. 27, 2012

(54) METHOD AND SYSTEM FOR MEASURING IN PATTERNED STRUCTURES

(75) Inventor: Cohen Yoel, Nes Ziona (IL)

(73) Assignee: Nova Measuring Instruments Ltd., Rehovot (IL)

( * ) Notice: Subject to any disclaimer, the term of this patent is extended or adjusted under 35 U.S.C. 154(b) by 390 days.

(21) Appl. No.: 12/526,084

(22) PCT Filed: Feb. 7, 2008

(86) PCT No.: PCT/IL2008/000172
§ 371 (c)(1),
(2), (4) Date: Aug. 6, 2009

(87) PCT Pub. No.: WO2008/096364
PCT Pub. Date: Aug. 14, 2008

(65) Prior Publication Data
US 2010/0099033 A1    Apr. 22, 2010

(30) Foreign Application Priority Data
Feb. 7, 2007   (IL) .......................................... 181209

(51) Int. Cl.
G03F 9/00   (2006.01)
G01B 11/00   (2006.01)
G01B 11/30   (2006.01)
(52) U.S. Cl. ........... 430/30; 356/600; 356/636; 382/145
(58) Field of Classification Search ................... 430/30; 382/145; 356/600, 636
See application file for complete search history.

(56) References Cited

U.S. PATENT DOCUMENTS
7,184,152 B2 * 2/2007 Brill .............................. 356/636
* cited by examiner

*Primary Examiner* — Christopher Young
(74) *Attorney, Agent, or Firm* — AlphaPatent Associates Ltd.; Daniel J. Swirsky

(57) ABSTRACT

A sample having a patterned area and a method for use in controlling a pattern parameter is presented. The sample comprises at least one test structure having a patterned region similar to a pattern in the patterned area, the patterns in the patterned area and in the at least test structure being produced by the same patterning process. The at least one test structure comprises at least one pattern parameter of a predetermined value intentionally increased above a natural value of said certain parameter induced by a patterning process. By this, the natural value of the parameter induced by the patterning process can be determined.

15 Claims, 13 Drawing Sheets ated Application No. 181,209, filed Feb. 7, 2007, all of which disclosures are hereby incorporated by reference.

METHOD AND SYSTEM FOR MEASURING IN PATTERNED STRUCTURES

CROSS-REFERENCE TO RELATED APPLICATIONS

This application is a U.S. National Phase Application under 35 U.S.C. 371 of PCT International Application No. PCT/IL2008/000172 which has an international filing date of Feb. 7, 2008, and which claims priority from Israel Patent Application No. 181,209, filed Feb. 7, 2007, all of which disclosures are hereby incorporated by reference.

FIELD OF THE INVENTION

This invention is in the field of optical measurement techniques, and relates to a method and system for measuring parameters of a structure, particularly useful for patterned structures such as integrated circuits, e.g. for controlling a patterning process (e.g. lithography).

BACKGROUND OF THE INVENTION

In the semiconductor industry, one of the important procedures of advanced process control is control of geometrical dimensions of a structure being processed. Such measurements can be carried out by an AFM or CDSEM metrology tool. These are stand alone, bulky tools, the measurements being relatively slow. Another example for such kind of measurements is optical critical dimension metrology (Optical CD). In this technique, spectral and/or angular analysis of light reflected from a patterned (periodic) structure is used to measure the parameters that define/characterize the structure.

The Optical CD technique (known also as Scatterometry) is very efficient for measuring parameters of patterned (periodic) structures. Optical CD measurements are usually performed using a fitting procedure. According to this procedure, a theoretical model describing the structure under measurements is used to generate a theoretical signal; this signal is iteratively compared to the measured signal, while varying the model parameters or a previously prepared library of theoretical signals is used or a combination of both techniques is used. In cases where a parameter of the structure has no effect on the signal, this parameter is kept fixed in the model. When a parameter has a weak effect on the signal, it is also often kept fixed to prevent adding instability to the model. In the case of random or unknown parameters, they are usually not included in the model (un-modeled parameters).

SUMMARY OF THE INVENTION

There is need in the art to facilitate measurements of parameters characterizing a patterned structure, for example for the purposes of process and/or quality control, by providing a novel measurement technique capable of measuring the so-called "weak parameters". The term "weak parameter" used herein refers to a feature of a structure responding to incident light by an optical signal of a level below the signal component detectable with the acceptable signal-to-noise of an optical measurement system, or responding by an optical signal that interacts strongly with signal(s) associated with other features or effects of the structure.

As indicated above, OCD is used for measuring in patterned structure. Scatterometry technology is considered to be the best cost effective option for integration in the lithography cell and in etch tools. Currently many metrology tool integrations are already working in production for the process control of Etch and Litho process tools.

OCD provides for precise measurements of features having relatively strong optical response, detectable with the acceptable signal-to-noise of the measurement signal. As for the weak effects, such as for example LER (Line Edge Roughness), the OCD techniques might not be effective. Also, the performance of optical measurement techniques is linked to the level of interaction between the effects/signals associated with different features/parameters of the structure. A problem with using OCD for measurement of some weak parameters of a patterned structure, such as LER, is also associated with the fact that typical wavelengths that OCD tools are using today are above 200 nm while the basic need for measurement of such random phenomena on the side walls as LER is 2 orders of magnitude lower.

The present invention solves the weak parameter problem by providing a novel technique enabling use of the principles of OCD metrology (or Scatterometry) for measuring various parameters of the structure. The technique of the present invention consists of providing at least one test structure (typically within a test site of an article/structure to be measured) having a patterned feature configured with an enhanced effect of the respective parameter.

Preferably, a plurality of pre-designed test structures are provided with different intentionally introduced effects of a certain parameter. Generally speaking, the present invention provides for amplifying the sensitivity of an optical measurement system to specific "weak" parameter(s), which would otherwise be non-detectable and/or non-model-able by the measurement technique with a desired accuracy. More specifically, the invention provides for enhancing the optical response of a certain feature of the structure by a predetermined value, to thereby increase the signal-to-noise of to measurements for this specific parameter.

Considering for example such a parameter or feature as Line Edge Roughness (LER), which is a parameter that might affect dopant concentration profiles or off-state leakage currents and drive currents, the present invention enhances the LER effect by intentionally introducing a predetermined profile of roughness into a line edge while manufacturing a test structure with a lithography tool (e.g. imprinting technique). The introduced profile of roughness is such that a total signal, resulting from this intentionally introduced line edge roughness and line edge roughness affected by a patterning process, becomes higher than a threshold defined by a signal-to-noise ratio of the measurement system.

According to some embodiments of the invention, a processing tool is applied to a sample to create a plurality (at least two) of test structures, namely a plurality of patterned regions differing from one another in a certain patterned feature, e.g. intentional LER, line width, etc. These test structures are created while introducing into at least one of them a known detectable intentional (synthetic) error in the respective parameter(s), e.g. introducing LER of a synthetic value detectable by OCD. These test structures are the so-called "calibration test structures", namely structures manufactured for the purposes of creation of calibration data to be then used for actual measurements on similar test structures associated with articles progressing on a production line. The calibration test structure(s) undergo(es) measurements by a measuring tool, such as CDSEM or AFM, and the actual values of LER are measured. Thereafter, the same calibration test structures undergo OCD measurements for measuring corresponding merit function values, and calibration data is created (e.g. a calibration curve is plotted). This calibration data presents a merit function vs LER. In this connection, it should be understood that the value of the synthetic error is selected such that the merit function corresponding to the LER, being a sum of the synthetic error and a natural error (that affected by the patterning tool) is higher than a measurable threshold of the system (defined by its signal to noise ratio or sensitivity) for at least some of the calibration test structures. The calibration curve is then used for actual measurements on similar test structures using an OCD technique. It should be understood that "similar" structures are structures having similar layer stacks and similar patterns.

In some embodiments, various groups of test structures (at least two for each group) are used, each group having different types of LER errors. These include for example random variation of synthetic LER, periodic variation of synthetic LER, e.g. of high and low pitch of the error in the direction parallel to the line edge, and variation in the phase relation between the periodic error on opposite sides of a line.

Thus, according to one broad aspect of the invention, there is provided a sample having a patterned area and comprising at least one test structure having a patterned region similar to a pattern in said patterned area, the patterns in the patterned area and in said at least test structure being produced by the same patterning process, wherein said at least one test structure comprises at least one pattern parameter of a predetermined value intentionally increased above a natural value of said certain parameter induced by a patterning process, thereby enabling determination of the natural value of said certain parameter induced by said patterning process.

In some embodiments of the invention, said at least one parameter includes at least one of a line edge roughness (LER), a line width or a line shift.

Preferably, the sample comprises a plurality of the test structures including at least two test structures differing from one another by said intentionally increased value of the at least one parameter. The plurality of test structures may include the test structure with no intentionally increased parameter.

The sample may be a semiconductor wafer or a reticle.

According to another broad aspect of the invention, there is provided a method for use in controlling at least one parameter of a patterned structure characterizing a patterning process applied to the structure, the method comprising:

(i) providing calibration data indicative of a merit function characterizing optical measurements in a patterned structure as a function of values of a certain parameter of the pattern including at least one value of the merit function below a certain threshold and at least one value of the merit function above said certain threshold;

(ii) applying the optical measurements to at least one test patterned structure and determining a merit function, wherein the test patterned structure is characterized by a value of said certain parameter of the pattern intentionally increased by a predetermined value above a natural value of said certain parameter induced by a patterning process by which said pattern is produced on the test patterned structure;

(iii) analyzing the determined merit function and the calibration data and determining said natural parameter value.

The providing of the calibration data may be carried out as follows: At least one calibration test structure is prepared being characterized by a value of said certain parameter of the pattern intentionally increased by a predetermined value above a natural value of said certain parameter induced by a patterning process by which said pattern in the calibration test structure is produced. An engineering measurement tool (such as CDSEM and/or AFM) is applied to said at least one calibration test structure and said certain parameter is measured. Then, the optical measurements (such as OCD measurements) are applied to said at least one calibration test structure, the merit function is determined, and the calibration data is created in the form of the merit function and corresponding values of the measured parameter.

The providing of the calibration data may also be carried out as follows: At least one calibration test structure is prepared being characterized by a value of said certain parameter of the pattern intentionally increased by a predetermined value above a natural value of said certain parameter induced by a patterning process by which said pattern in the calibration test structure is produced. Then, the optical measurements (such as OCD measurements) are applied to said at least one calibration test structure, the merit function is determined, and the calibration data is created in the form of the merit function and corresponding values of the intentionally varied parameter.

The OCD measurements may comprise at least one of normal incidence scatterometry, polarized normal incidence scatterometry, angle-dependent spectral scatterometry, angle-dependent laser scatterometry, spectral ellipsometry etc.

In some embodiments of the invention, the providing of the calibration data comprises preparing a plurality of the calibration test structures comprising at least two calibration test structures differing from one another in said intentional value of the certain parameter. The plurality of the calibration test structures include a calibration test structure with no intentional increase of said certain parameter.

The preparation of the at least one calibration test structure may comprise modeling an effect of the intentional increase of the certain pattern parameter and estimating an optimal range for said values of the intentional increase of the certain parameter.

The parameter to be controlled is such that an effect of this parameter onto the merit function is substantially orthogonal to effects of all other parameters of the structure onto the merit function.

The parameter to be controlled may be a fixed parameter for an optical model used for determination of the merit function.

The providing of the calibration data may comprise optical measurements on a patterned area in a sample to be controlled and determination of a merit function corresponding to a natural value of said certain parameter of the pattern resulting form the patterning process applied to the patterned area.

According to yet another broad aspect of the invention, there is provided a method for use in controlling a patterning process applied to a sample to create a patterned structure, the method comprising:

(i) providing calibration data indicative of a merit function characterizing optical measurements in a patterned structure as a function of values of a certain parameter of the pattern including at least one value of the merit function below a certain threshold and at least one value of the merit function above said certain threshold;

(ii) applying the optical measurements to at least one test patterned structure and determining a merit function, wherein the test patterned structure is characterized by a value of said certain parameter of the pattern intentionally increased by a predetermined value above a natural value of said certain parameter induced by a patterning process by which said pattern is produced on the test patterned structure;

(iii) analyzing the determined merit function and the calibration data and determining said natural parameter value.

According to yet a further aspect of the invention, there is provided a method for use in controlling a patterning process applied to a sample to create a patterned structure, the method comprising:

(i) providing calibration data indicative of a merit function characterizing optical measurements in a patterned structure as a function of values of a line edge roughness including at least one value of the merit function below a certain threshold and at least one value of the merit function above said certain threshold;

(ii) applying the optical measurements to at least one test patterned structure and determining a merit function, wherein the test patterned structure is characterized by a value of said line edge roughness intentionally increased by a predetermined value above a natural value of said line edge roughness induced by the patterning process;

(iii) analyzing the determined merit function and the calibration data and determining said natural value of the line edge roughness.

More specifically the present invention is used for measuring parameter(s) characterizing a pattern created by a patterning tool arrangement, such as a wet- or dry-lithography tool or a stamper used in imprinting technique, aimed at process and/or quality control and/or article inspection. Also, the present invention is particularly useful for monitoring such parameters as LER. Therefore, the present invention is described hereinbelow with respect to this specific example. It should, however, be understood that the invention is not limited to this example.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

Figure 1A:
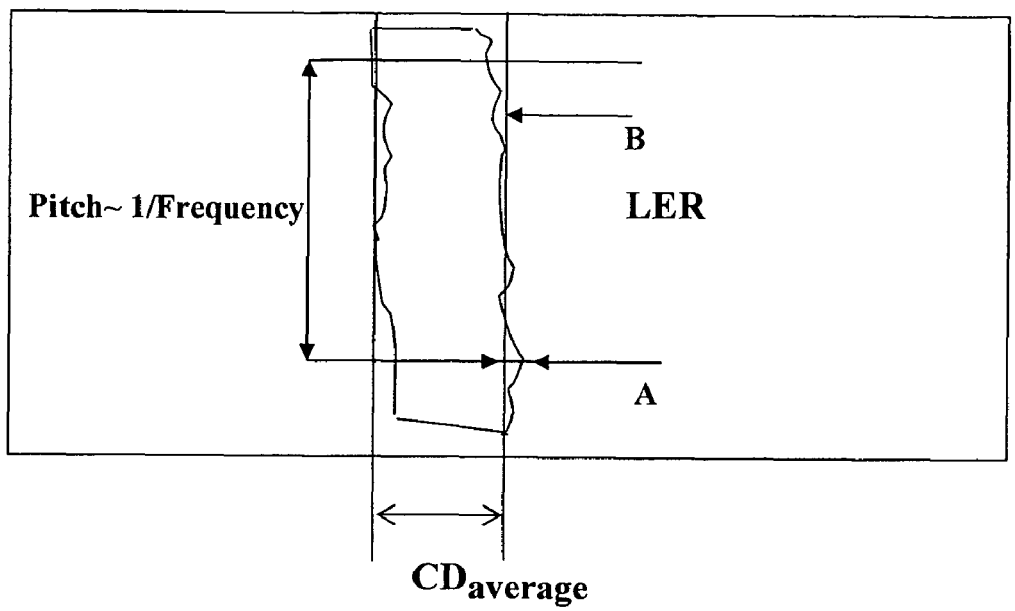
FIGS. 1A and 1B present respectively schematic definition of a line edge roughness (LER) and typical LER that can be obtained by a specific mask design.

As indicated above, according to the conventional techniques for measuring in patterned structures based on OCD measurement technique, a fitting procedure is usually employed, whereby a theoretical model describing a structure under measurements is used to generate a theoretical signal, and this signal is iteratively compared to the measured signal, while varying the model parameters, or a library is used or a combination of both. According to this technique, a merit function is typically determined and compared to a certain predefined threshold. However, if a parameter of the structure has no detectable effect on the signal and/or cannot be modeled, the merit function cannot be used to determine the value of the parameter.

The present invention provides an alternative approach enabling determination of a variation of the merit function with the variation of the respective parameter using one or more test structures, where at least one of them has an intentionally induced synthetic change of said parameter added to that naturally induced by a manufacturing process. Preferably multiple series of such sites or test structures is/are used with multiple values of the intentionally induced synthetic change. The latter design is aimed at creating a situation, were the sensitivity of the measurement is made sufficient by use of multiple independent measurements.

The following are examples of measuring "weak parameters", such as the line edge roughness (LER) parameter, line-width parameter and line-shift parameter. LER presents fluctuations in the line edge of lithographic features, and always exist as a result of patterning process. At 32 nm line width (and below), LER can be a significant fraction of the feature dimensions. LER can be simply detected by AFM or SEM techniques.

As indicated above, according to some embodiments of the invention a series of test sites are used to enable obtaining information on the required parameter under varied conditions. The structure parameters are varied in the test sites in such a way that certain measurement signals exceed the basic system noise level. It should be noted that generally, a single test site (also termed here "test structure" or "test patterned region") can be used in which a synthetic value is added to a certain structure parameter. In this case the second structure providing the respective parameter value for creation of a calibration curve is an actual structure under measurements (i.e. under processing by the process to be controlled). The second structure presents a zero synthetic value, i.e. the pure natural value of the parameter. Another option is the use of two test sites with different synthetic values of the certain parameter, where one of these values is zero or small such that the corresponding merit function is substantially on the base line. Preferably, at least two test sites are used with different non-zero synthetic values of the same parameter of the pattern.

In the present example, the LER is a random phenomenon that could be characterized by its amplitude and frequency. Modeling of such a parameter is a very difficult task. Therefore, it is possible to consider it as an un-modeled parameter.

Figure 1B:
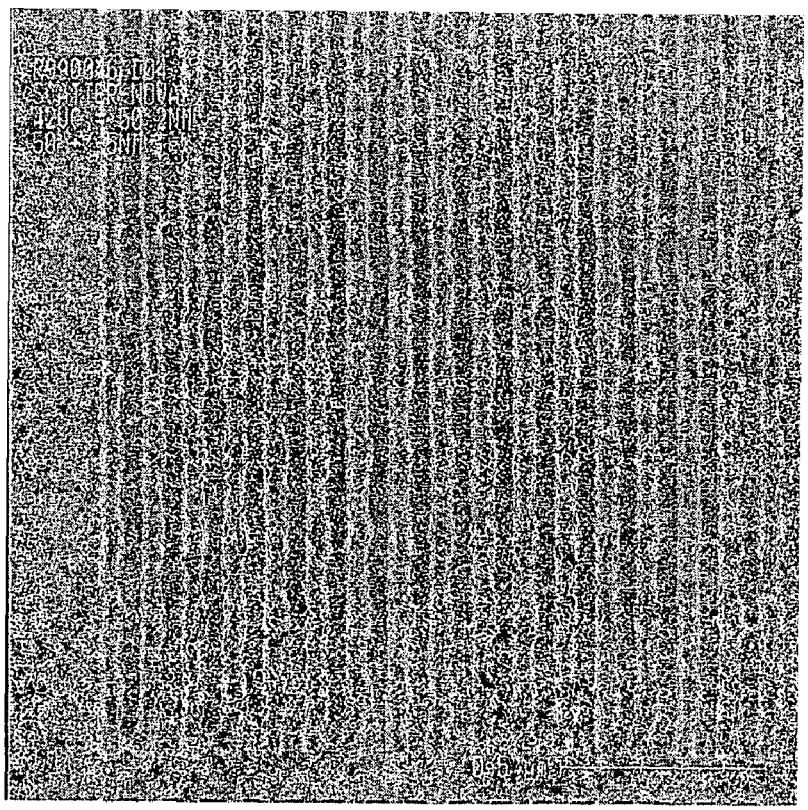

Reference is made to FIGS. 1A and 1B presenting respectively schematic definition of LER and typical LER that can be obtained by a specific mask design. As shown in FIG. 1A, LER can be defined by the variations of critical dimension, $CD_{max}$, and repeatability of its maximal amplitude, A, along the lines, where the amplitude is determined in relation to the average straight line B. FIG. 1B shows typical synthetic roughness of photoresist lines on a Si substrate with CD being 50 nm and roughness amplitude being 5 nm.

Figure 2:
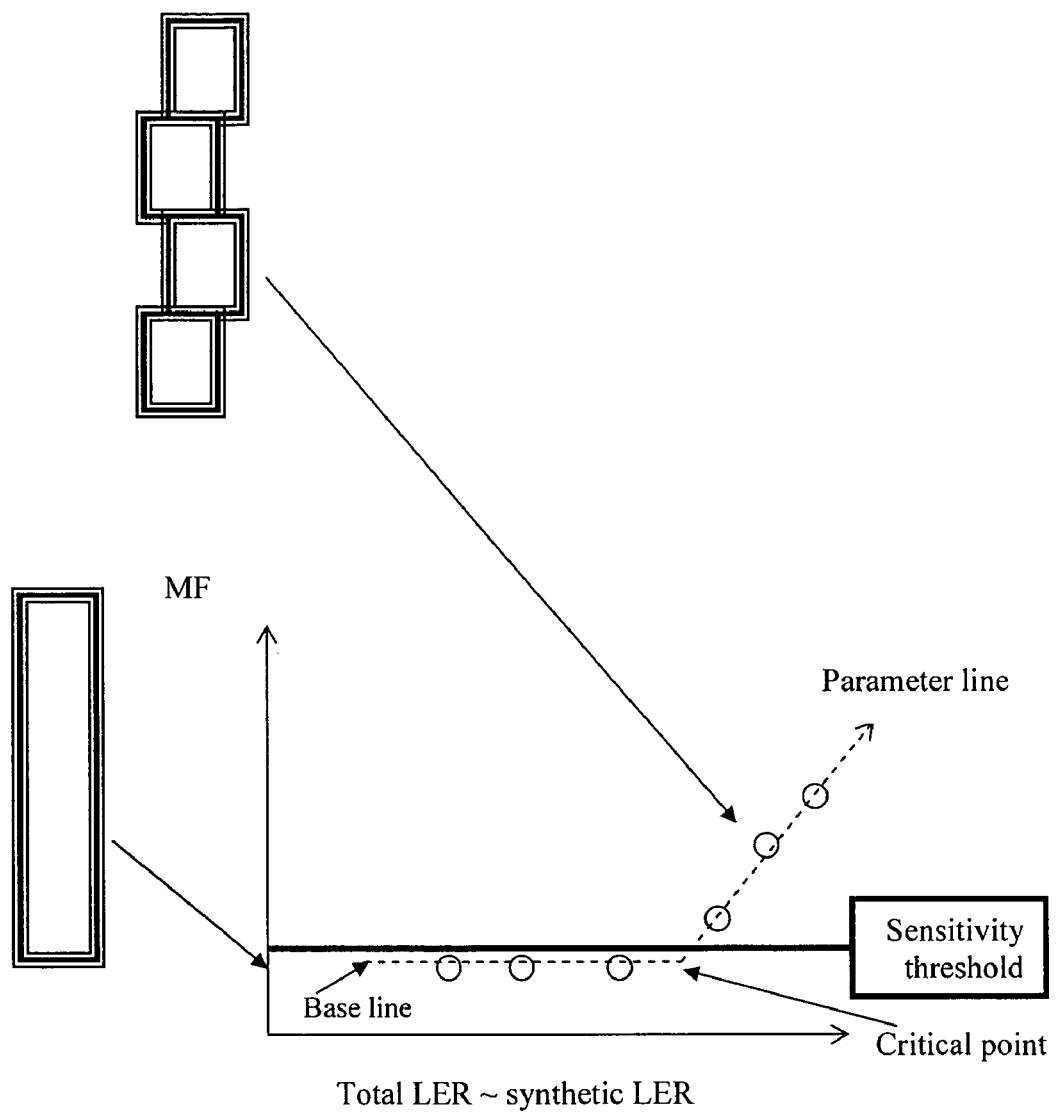
FIG. 2 illustrates simulated calibration curve of LER, obtained by OCD measurement technique on a structure with LER.

FIG. 2 illustrates results of simulated curve of LER, obtained for example by polarized spectral reflectometry on a structure with line edge roughness. The graph in FIG. 2 presents a merit function (MF) vs the LER value. The merit function is based on the goodness of fit of the model to the structure, where the model includes parameters describing the structure but not taking into account the un-modeled parameter LER. MF showing better goodness of fit is represented by lower values. This graph has two regions, a first region defined for lower LER values, namely values below the sensitivity threshold of the measurement system, and a second region for the large LER values, namely values above the sensitivity threshold. In the first region of the curve, corresponding to the weak LER, the MF vs. LER amplitude is substantially "flat", due to the zero sensitivity of the fit level (MF) to the un-modeled parameter (LER amplitude). In the second region, the fit of the model has certain sensitivity to the LER parameter causing the fit level MF to change with the variation of the LER parameter. In both regions, the LER parameter was not included to the model.

The first flat region of the MF vs. LER curve is determined by the tool random and systematic errors (natural, processing tool or photoresist induced values of LER) and presents a so-called "base line". These errors determine the vertical location of the MF level of the flat part (base line) of the curve, and this is the basic limitation associated with the "sensitivity threshold" of the measurement system. The second region, where the un-modeled parameter is above the "sensitivity threshold", presents a "parameter line" or "sensitivity line", where the respective parameter can be directly measured to determined its variations. The point, where the horizontal "base line" intersects the parameter line, is the "critical point" which distinguishes between the values of the LER that can normally be measured by OCD technique and the values that cannot. In the second region, i.e. parameter line, the slope of the MF vs. LER indicates that the increase of LER measurably affects the spectrum, and due to the fact that this parameter is not modeled, the quality of fit (MF) decreases. The level of the sensitivity is defined by the slope.

The present invention enables measurement of un-modeled parameters, e.g. LER, with values below the sensitivity threshold. To this end, at least one test site is prepared having a patterned region created by a process to be controlled and having a certain parameter, e.g. LER, of intentionally induced synthetic value, in addition to the natural value induced by the natural process. Thus, the measured LER is the combination of synthetic roughness and the process (natural) LER.

Figure 3:
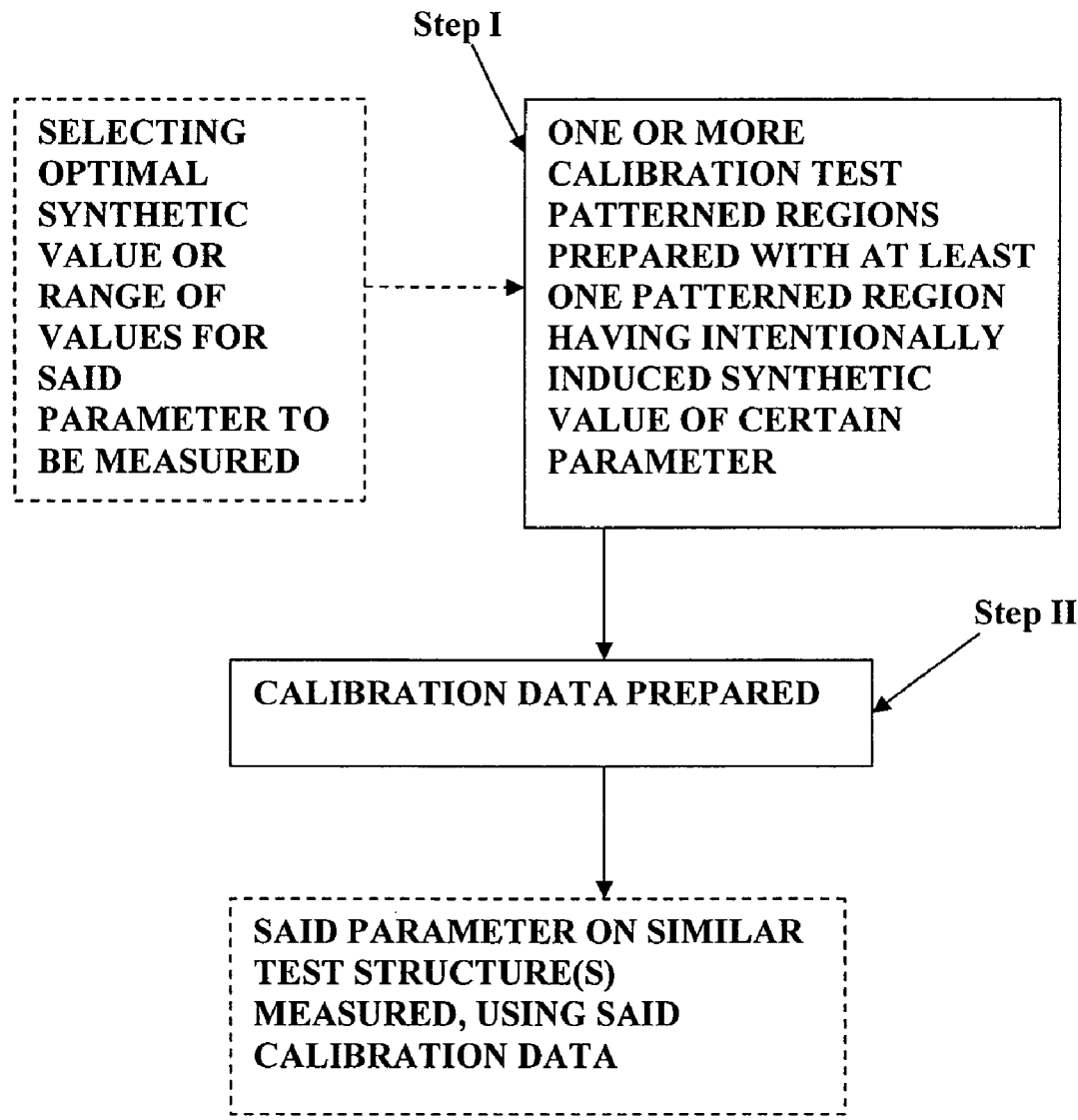
FIG. 3 shows the main steps in a method of the present invention for monitoring a pattern parameter, e.g. LER or line width.

Reference is made to FIG. 3, showing the main steps in a method of the present invention.

One or more calibration test structures are created (step I), where at least one of these test structures has a patterned region created by a process to be controlled while inducing a synthetic value into a certain parameter characterizing the process. Preferably, this synthetic value is previously selected such that merit function corresponding to the resulting parameter (being a sum of the synthetic and natural values) is higher than a sensitivity threshold of the measurement system. In order to appropriately select the synthetic parameter value, preliminary measurements and analysis can be carried out, as will be described further below. Alternatively, or in addition to carrying out preliminary measurements/analysis, a plurality of patterned regions can be produced with different synthetic values of said parameter. In both cases, at least one patterned region with zero or relatively small synthetic value is used (to provide the merit function on the base line), where such patterned region may be a test structure or an actual patterned structure being manufactured.

Calibration data is then prepared (step II), preferably by applying measurements to the patterned regions with different values of the respective parameter. The calibration data, which may be in the form of a calibration curve, is indicative of merit function (a level of fit) vs the respective parameter values, including base line related data portion (constituted by at least one measurement corresponding to the merit function for the parameter value below the sensitivity threshold) and sensitivity line related data (constituted by one or more measurements corresponding to the merit function values) for the parameter values (above the sensitivity threshold).

In some embodiments of the invention, the preparation of the calibration data includes CD SEM or AFM measurements of the respective parameter values in different patterned regions including that of the zero synthetic value, and then OCD measurements on said patterned regions to determine the corresponding MF values. In certain cases it is possible to base the calibration curve on the nominal intentional synthetic values, especially where the natural parameter variation is large.

Then, actual OCD-based measurements can be applied to similar test structures while undergoing said processing on a production line, to determine the respective parameter induced naturally by the processing.

Figure 4:
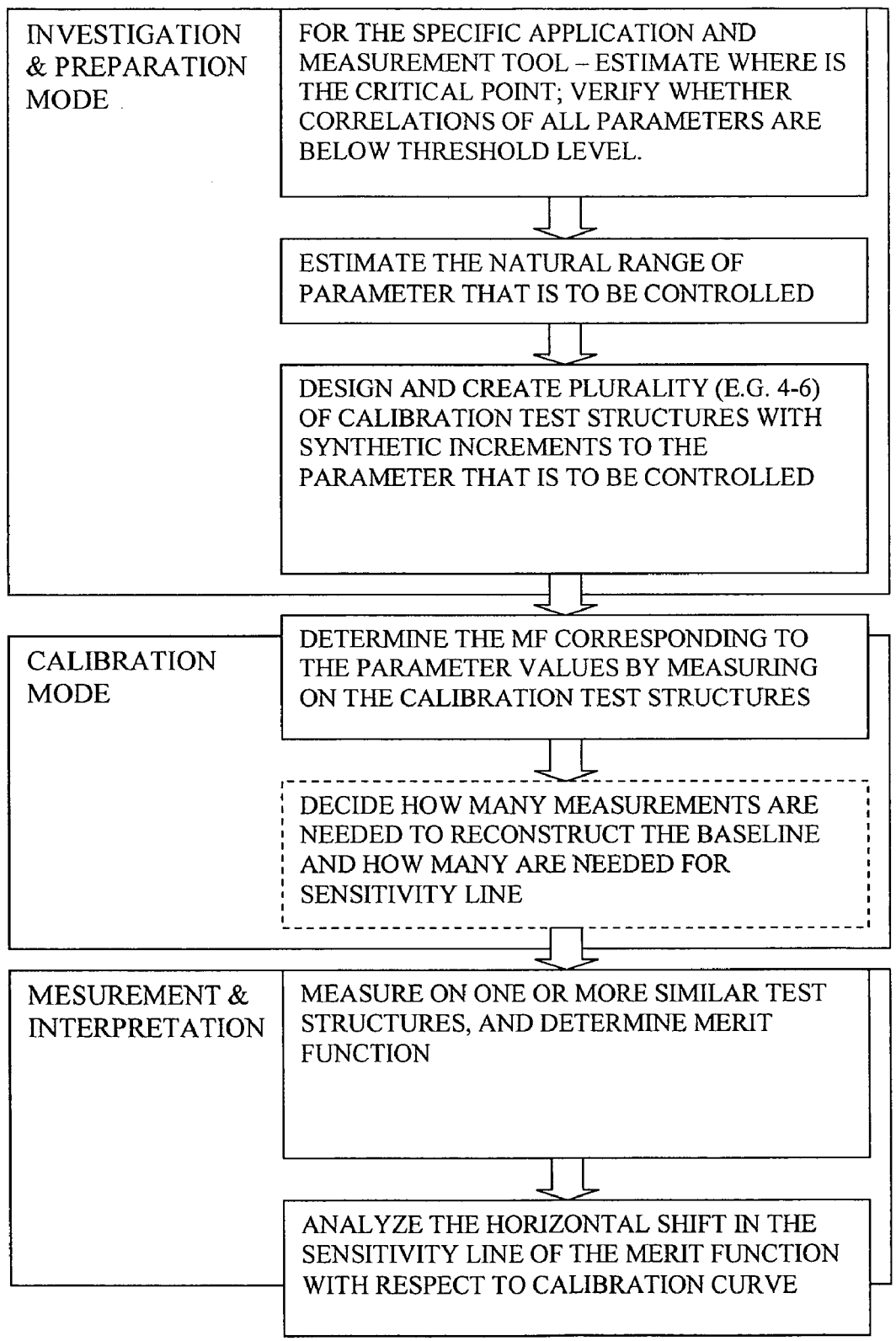
FIG. 4 show a specific example of the method of the present invention for monitoring a LER parameter.

Reference is made to FIG. 4 showing a specific but not limiting example of a method of the present invention. Initially, the steps of investigation and preparation mode are carried out. These include estimation of the critical point (intersection between the base line and sensitivity or parameter line), which is required for some applications, as well as for some models and metrology tools. In addition, it might be required to verify that correlation between each of the modeled parameters and the un-modeled parameter are below a threshold level. For example, this can for example be done by a covariance matrix of the stack parameters.

Also, in some embodiments, estimation of the range of values of the parameter to be measured is desired.

This information can then be used to design test structures with a set of values of synthetic parameter that will allow the user to reconstruct both the base line and the sensitivity line. Once both the critical point and the range of parameter values are roughly known, a number (e.g. 4-6) test structures are designed with synthetic increments to the parameter that is to be measured; roughly half of the test structures could be designed to have merit function below the sensitivity threshold for a minimum parameter value, and the rest—above it. If there is an expectation of non-linear slopes, more patterned sites could be prepared.

Depending on a specific application, some additional optical model considerations can be made. For example, a method that relies on the MF sensitivity to the un-modeled parameter could be strengthened by additional verifications, as follows:

Minimum sensitivity of the "sensitivity line" or "parameter line" needs to be ensured for the specific un-modeled parameter that is to be measured (LER in this specific but not limiting example). For certain cases the sensitivity can be increased if the basic model is used (not fully optimized). In this case, the sensitivity threshold of the measurement system (defining the base line) will be higher (worse) but sensitivity curve (sensitivity line) will have a higher (better) slope.

Correlation analysis for the model parameters could be carried out to ensure maximum independence of the specific un-modeled parameter from the variable modeled parameters and the fixed parameters. This can be ensured if all the modeled parameters are uncorrelated to the un-modeled parameter. This procedure can be done by approximation (using as close as possible LER description) for the case of LER parameter, which has no accurate model.

All possible varying parameters could be included in the model except for the specific un-modeled parameters.

The value of the critical point on the un-modeled parameter axis (horizontal axis) could be verified. If the value is too high, the base line level may be lowered by using a metrology tool (measurement system) of improved performance and model accuracy, or the amplitude of the synthetic parameter on the test site(s) could be increased. The improvement in the base line achieved by model improvement and measurement tool improvement can cause the slope of the sensitivity line to be lower. The model improvement could include partial modeling of the random LER by including a 3-Dimensional model with pseudo-random roughness as part of the optical model of the patterned structure.

It should also be noted that preferably it should be verified that above the critical point the sensitivity line is steep enough to allow good precision. The precision is proportional to the projection of the sensitivity line in basic units of the threshold value on the horizontal axis. If the slope is too low it means that the effect of the parameter is too low on the measurement, in such case additional change to the test site or to the model can be done in order to have better (higher) slope. The amplitude of the larger synthetic parameter (LER) values can be increased to enhance the sensitivity.

Any measurement normally takes into account fixed parameters and variable parameters. Variable parameters are the parameters fitted by regression analysis or by a pre-calculated library. The fixed parameters are the rest of parameters that can be ignored or their range is very limited. For stable solutions, the fixed parameters should have a much smaller affect on the measurement than the variable parameters. Under these conditions, the model is assumed to be limited only by the noise and error levels of the measurement and the fixed parameter constant errors, thus creating a base line for best fit that can be achieved and reflect the quality of model fit. In the present case, where one parameter is ignored and the change of MF is used as indicator for the level of that parameter, it should preferably be verified that quality of the model has not changed. This includes measurements of the test sites on a sample with independently verified minimal random parameter (e.g. LER) and creation of data indicative of MF vs. said parameter (as exemplified in FIG. 2). Depending on the specific application, user can decide how many measurements are needed to reconstruct the base line and how many are needed for the sensitivity line. For this reason, at least one measurement should preferably be performed on test site(s) where the synthetic parameter (LER) is relatively small to ensure that the level of the base-line can be achieved. Preferably, two or more measurements are performed (i.e. two test sites with different synthetic values of the same parameter are prepared and used) These measurements must indicate that the level of fit is influenced by the LER in a specific levels and not influencing the level of fit for lower levels. Then, the above data is used for carrying a calibration curve.

Then, the above data is used for carrying out a calibration mode. This includes measurements of the test sites on a sample with independently verified minimal random parameter (e.g. LER) and creation of data indicative of MF vs. said parameter (as exemplified in FIG. 2). Depending on the specific application, user can decide how many measurements are needed to reconstruct the base line and how many are needed for the sensitivity line. For certain conditions, including case of large expected LER, the calibration curve can be created using the nominal parameter shifts instead of independent measurements.

Optional for extra verification, measurements can then be carried out on independently verified samples and the effect on the shift of the critical point could be calibrated.

Figure 5:
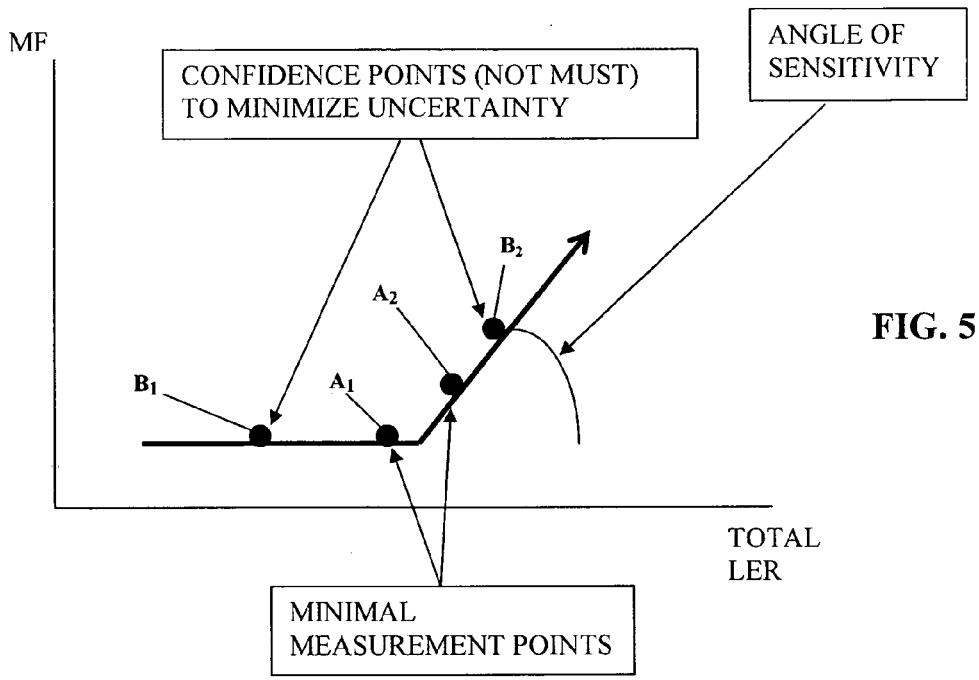
FIG. 5 exemplifies a measurement procedure for creating a calibration curve in the form of MF vs. LER values obtained using a plurality (e.g. 2-4) of measurements.

After preparation of the calibration data (curve), the OCD-based measurements could be done on actual samples (in a production line) where the natural parameter (LER) induced by a processing tool is unknown. In this connection, reference is made to FIG. 5, exemplifying a measurement procedure: The calibration curve in the form of MF vs. LER values is created by carrying out a number of measurements, e.g. 2-4 measurements. The basic idea is to get the same curve of MF vs. LER in the mode of production where uncontrolled natural LER exists. Measurements are carried out using the same series of test sites with stepped increments of the synthetic parameter, where at least two sites have values of the synthetic parameter below the critical point, and at least two sites have values of the synthetic parameter above the critical point. Measurement points $A_1$ and $A_2$ are the minimal number of measurements, and points $B_1$ and $B_2$ are confidence points which might be measured to minimize uncertainty. A slope of the parameter line with respect to the base line presents the sensitivity of the measurements for this specific parameter.

Figure 6:
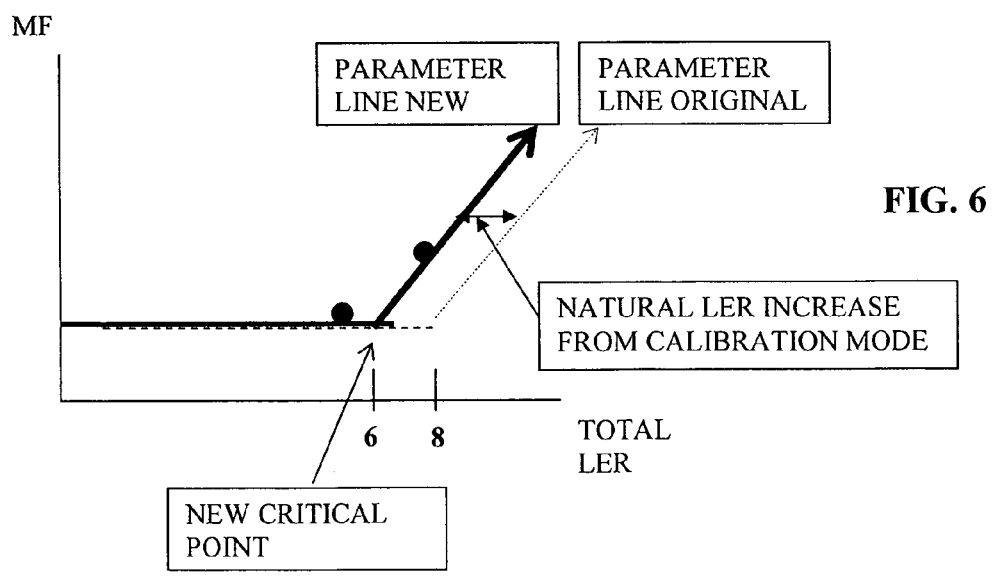
FIG. 6 illustrates the principles of analyzing the measured data on actual test structure(s) by utilizing the calibration data.

After the calibration curve is built, the measurement interpretation could be done. This may include the following:

The calibration curve can be compared to the measured curve. This is exemplified in FIG. 6, showing two curves, one being measured on the calibration test structures (dashed curve) and the other being measured on the actual, "measurement stage", test structures (solid curve). The shift of the sensitivity line to the left indicates worse MF at conditions where the amplitude of the synthetic LER is not supposed to have an affect according to calibration. It is attributed to the contribution of above threshold combination of synthetic and random LER.

In the case when the base-line rises to a higher value than that of the calibration curve, it can be attributed to a change of a parameter that was considered to be fixed, and therefore not modeled or to a change in the system accuracy relative to the structure model. In either case, the critical point has an expected motion: if the base-line rises then the critical point shifts to a higher value of the synthetic LER value. In other words, the base-line shift can be treated as an added noise source of the system causing realignment of the base-line and sensitivity-line that can be anticipated.

The following are some examples of simulation and experiments for the technique of the present invention. Here, scatterometry methodology was used based on existing Normal Incidence Polarized Reflectometry for the control of LER. The spectral change due to LER was calculated. Efficient test structures, for use in such measurements, were designed.

Figure 7:
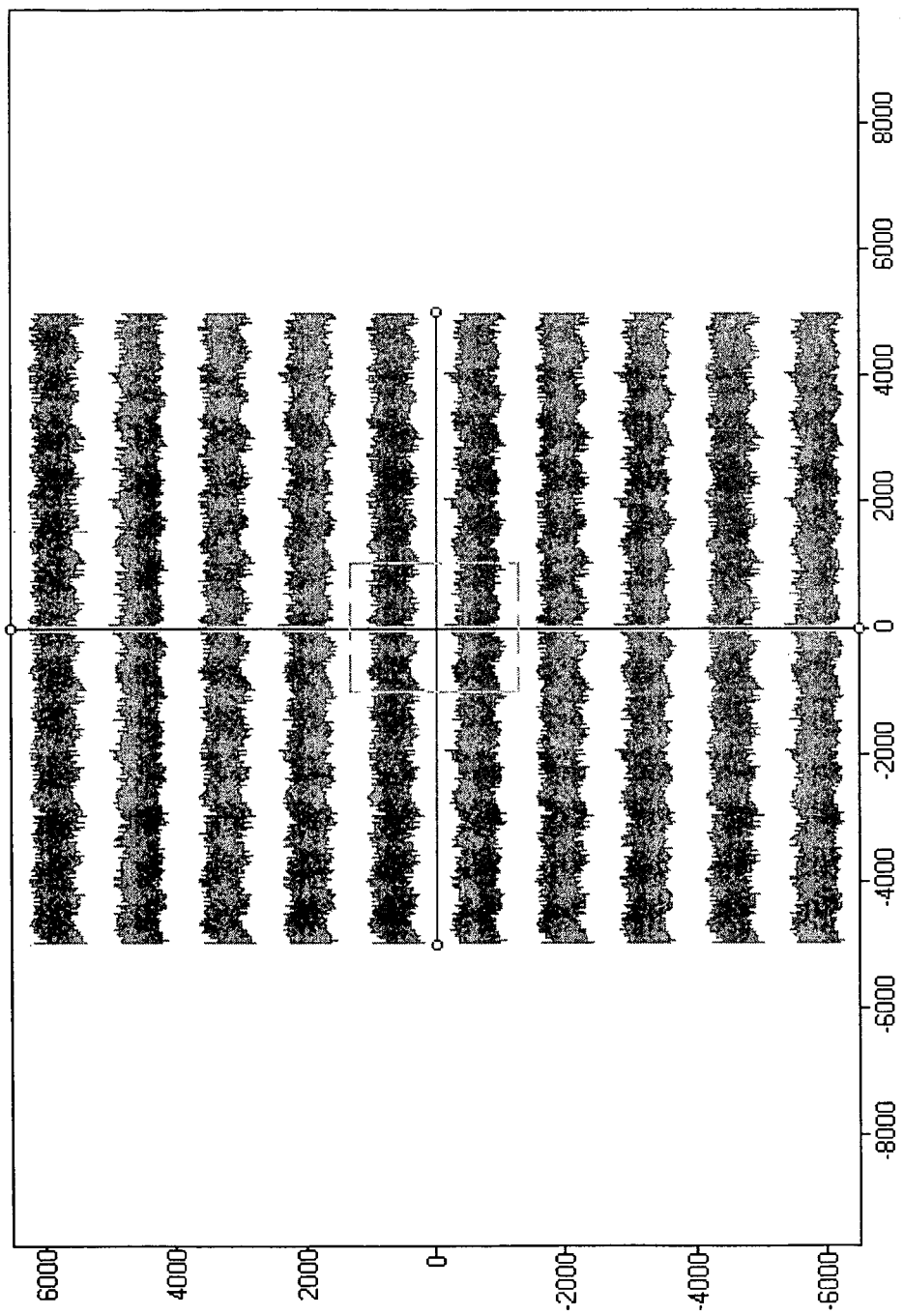
FIG. 7 illustrates a typical simulated layout of 65 nm equal line/space with pseudo-random edge roughness of 50 Å and sinusoidal edge roughness of 100 Å.

FIG. 7 presents a typical simulated layout of 65 nm equal line/space with pseudo-random edge roughness of 50 Å and sinusoidal edge roughness of 100 Å.

The theoretical sensitivity analysis is based on the understanding of the fact that a specific parameter can affect the spectrum thereby enabling measurement capability of this parameter. A simple test can be done with small step increases for a nominal case under investigation for a specific parameter by recording the spectral change. The sum of squared changes presents the merit function (MF) and is defined as:

$$M.F.=1/N\Sigma[I_{theoretical}(\lambda_i)-I_{theoretical+step}(\lambda_i)]^2 \quad (1)$$

where $I_{theoretical}$ is the theoretical data for the optical signal (detected optical response) from the respective feature of the patterned region and $I_{theoretical+step}$ is the optical signal from the respective feature with the enhanced effect; and $\lambda_1$ is the wavelength of light used in the optical measurements.

Larger spectral changes mean higher MF and therefore a better chance that the solution for this parameter is valid. To understand the tool capabilities, this sensitivity should be compared with the best fit levels that can be achieved in a real case. From fit to the measured spectrum, this is calculated in similar way and has the same dimensions and statistics:

$$\text{Best fit M.F.}=1/N\Sigma[I_{theoretical}(\lambda_i)-I_{measured}(\lambda_i)]^2 \quad (2)$$

Comparing equation [1] and [2] gives an initial approximation of the capability to measure a parameter.

The spectrum sensitivity described above is to be compared with the basic noise of the spectrum. Frequently, the major contribution of the MF in formula (2) is the noise level in the measurement, thus $I_{measured}$ in (2) can be replaced by $I_{theoretical+noise}$. In this case, the variance of the spectrum obtained from repeatability measurement is a good approximation for the noise reference. Typical characterization of a reflectometer tool involves the term SNR (Signal to Noise Ratio). For a typical OCD measurement tool with SNR of 1000 for all wavelengths that are involved, typical threshold capabilities of Best fit M.F. are about $10^{-6}$ where the MF is an RMS value of the difference between theoretical and measured spectra. The ratio between the basic tool noise and its sensitivity per parameter indicate the preliminary first order understanding of tool capability to measure this parameter. In a similar way, other non-systematic hardware errors can be included which reduce even further the SNR and therefore detract from its measurement threshold.

For real understanding of the tool capabilities to measure a specific parameter, the sensitivity of the parameters to variations as well as the correlation coefficient between parameters should be analyzed to create uncertainty values for all parameters. Parameters can be ranked on weak to strong scale according to their sensitivity. The weaker the parameter, the closer its effect is to the noise level. Therefore, noise might affect the parameter interpretation. This is why in many cases such weak parameters are preferably fixed. In cases where these parameters are fixed, their change is to be considered in the analysis since their neglected variability effectively increases the noise. The penalty for not including a specific parameter within the floating parameters affects the final fit in two ways: The first effect is associated with random changes or systematic changes that are below the noise levels where the model parameters are ignored or fixed. This effect can be considered as an additional contribution of error which can be added to the tool model noise, hence the best fit baseline will be slightly higher than the ideal noise case without such changes. The second effect is associated with random changes or systematic changes that are higher than the noise levels. For a higher level of systematic changes of a specific parameter that is included in the model, the change in the level of fit is proportional to the magnitude of change in the ignored parameter. In the case of orthogonality of the ignored parameter to the other parameters involved in the model, the change of this parameter from the model nominal will sharply affect the level of fit. In the case of correlation (non-orthogonality) to other model parameters, it will mostly contribute to systematic errors of the correlated parameters. The performance and stability of each of the parameters can be predicted, for example using appropriate software.

An experimental example of the method with controlled and known LER was tested. The considerations for LER design were as follows: a large range of intentional LER is to be produced because of the unknown performance of the OCD tool and its model sensitivity dependence on density and period; and large steps were included in intentional LER values in order to verify that the parameter is characterized with no uncertainties.

Figure 8:
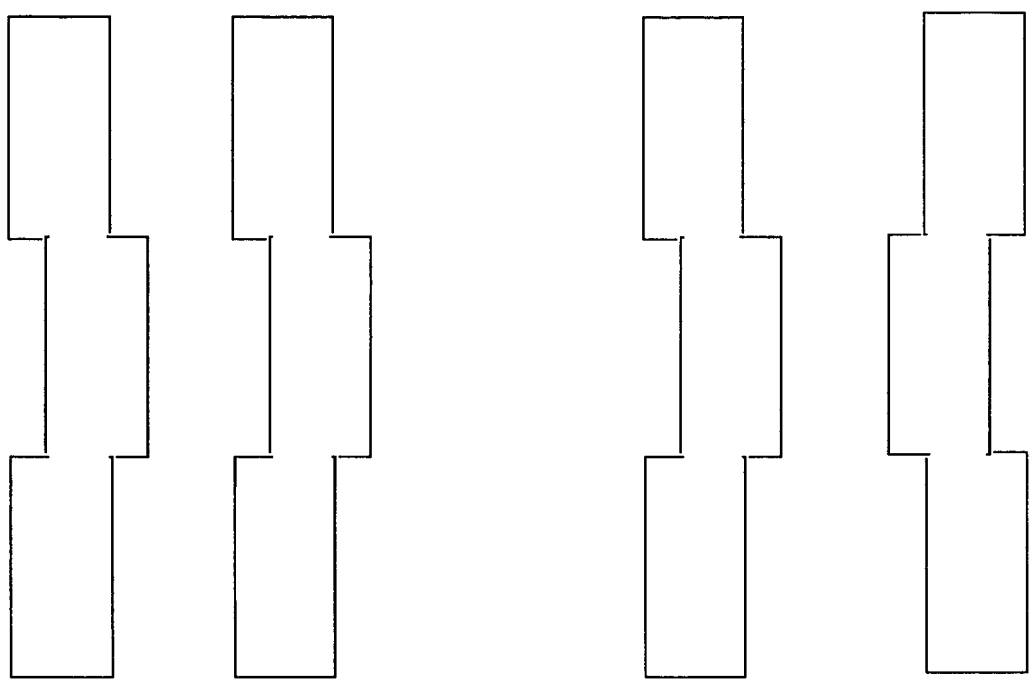
FIG. 8 Illustrates the layout of basic structures of the design having in phase (left) and out of phase (right) line edge roughness.

Samples with intentional LER were created by eBeam lithography. The design simulated process LER by using a rectangle (gate-line like) with different aspect ratios, different rectangular widths and different but known roughness on them. In the layout designs, the rectangular length was 70 μm, the rectangular widths were in the range 50 nm-180 nm. The line/space aspect ratios were 1:1, 1:2, 2:1, 1:3 and the roughness levels were 0, 2.5, 5, 7.5, 10 and 15 nm. The type of edge variations was controlled as well: three types of edge variations were performed, defined as "in phase", "out of phase" and "random". FIG. 8 Illustrates layout of basic structures of the design, in phase (left) and out of phase (right). The "random" type of edge variation is presented by a synthetic line edge fluctuations design with a random generator. A matrix containing all combinations for these parameters was made. Another variable that was added to the matrix was the frequency of synthetic roughness change. This was another split to high frequency (HF) and low frequency (LF), where LF indicates frequency in the range of the period while the HF indicates a double frequency.

Figure 9:
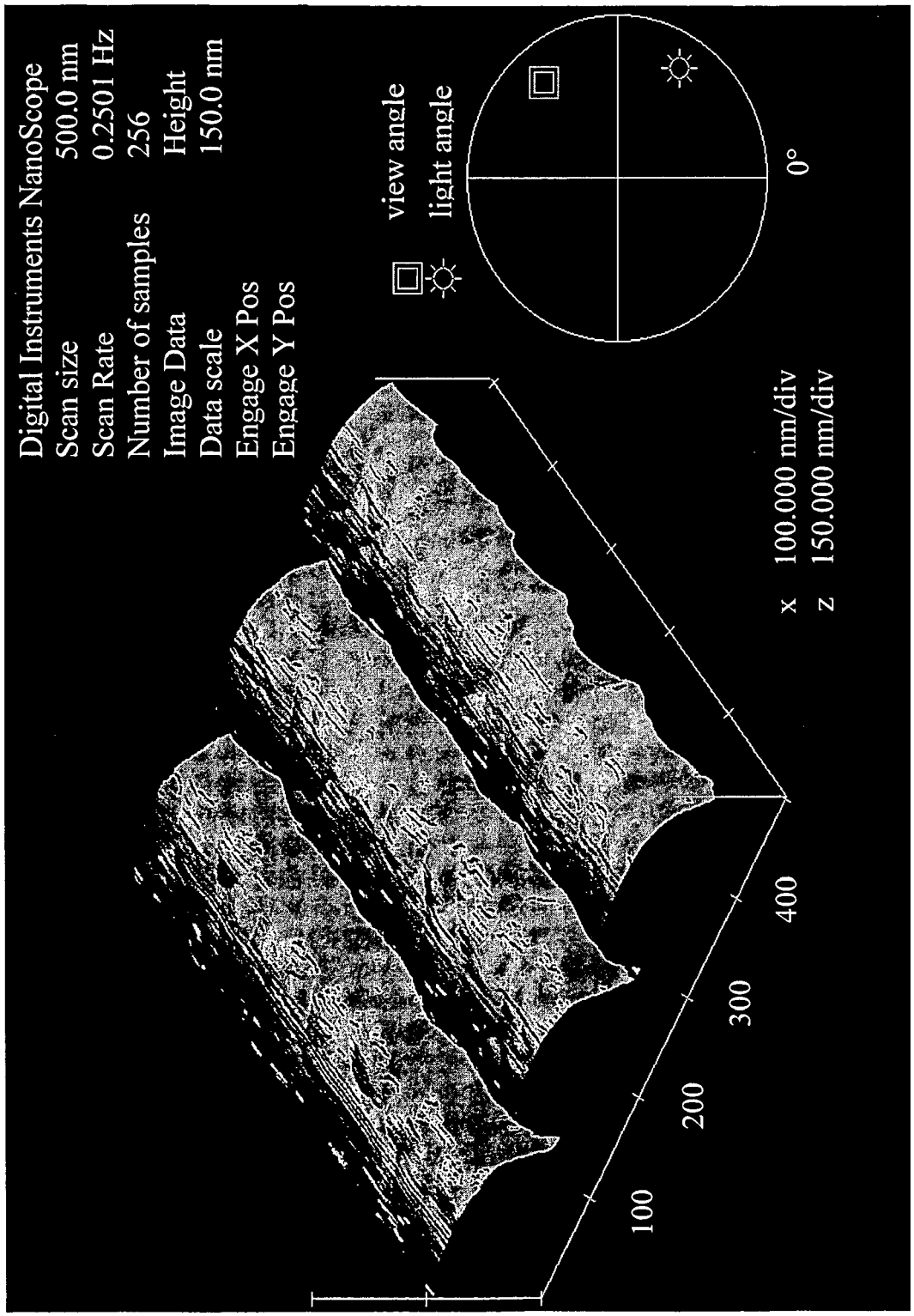
FIG. 9 exemplifies the AFM high resolution image of structures with 180 nm period and 15 nm roughness, high frequency out of phase synthetic roughness.

Each one of the wafers (patterned structures) produced was examined by CDSEM in order to characterize the roughness on each structure, the repeatability of the structures and the matching between the GDSII file and the real structure. AFM characterization was performed using a high resolution AFM tip to reveal the three-dimensional image of the structures produced—see FIG. 9 showing AFM high resolution image of structures with 180 nm period and 15 nm roughness, high frequency out of phase synthetic roughness. In this figure, the scan was done using high resolution tips, which were characterized with an extra tip with radius of curvature of 1 nm and height of 100-200 nm. The measurements were done using a frequency of 0.3-1 Hz in tapping mode.

Scattered light detection was performed with the NovaScan 3090 tool (commercially available from Nova Measuring Instruments, Ltd., Israel) using several recipe models. The data was compared to the data collected from the imaging characterization tools. Several cross-section models were examined and the best fit was achieved with a trapezoidal shape that is covered with spacers that have independent angles. These spacers were ostensibly filled with effective medium material with parameters that were a mixture of the photoresist material and the air ambient. An independent fit of the material component ratio yielded the expected result of 50% and thus served as a sanity check.

Figure 10:
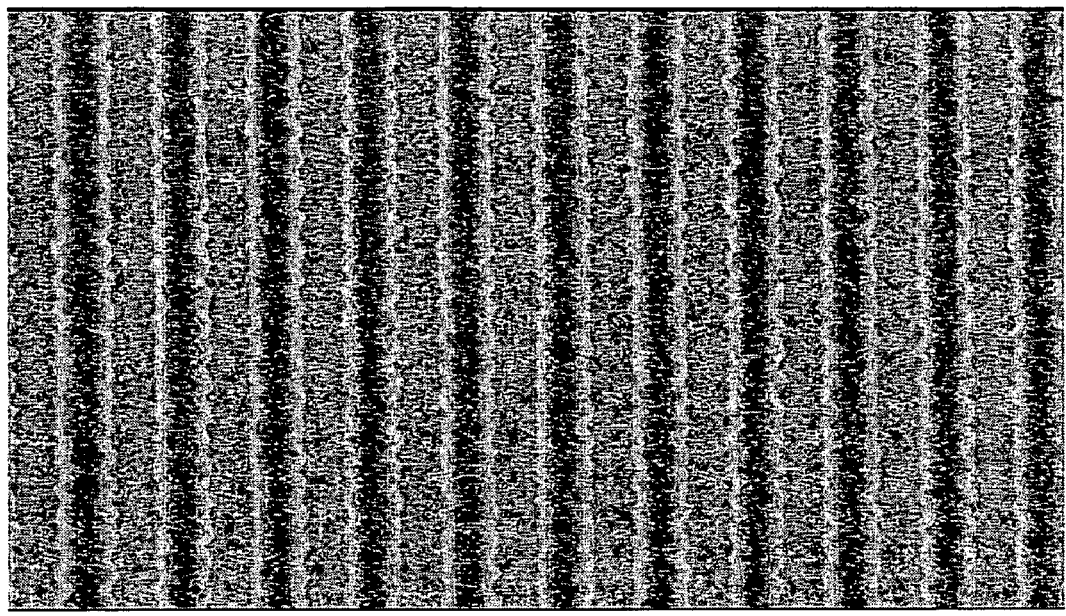
FIG. 10 exemplifies the CDSEM image of 85:85 nm line/space structure, 10 nm roughness with high frequency out of phase synthetic roughness.

CDSEM images gave additional reference for the CD of the analyzed structures—see FIG. 10 showing the CDSEM image of 85:85 nm lien/space structure, 10 nm roughness with high frequency out of phase synthetic roughness.

The LER was detected from the image, the information being local as the LER determination required high magnification. This method of measurement provides only two-dimensional metrology analysis.

Figure 11:
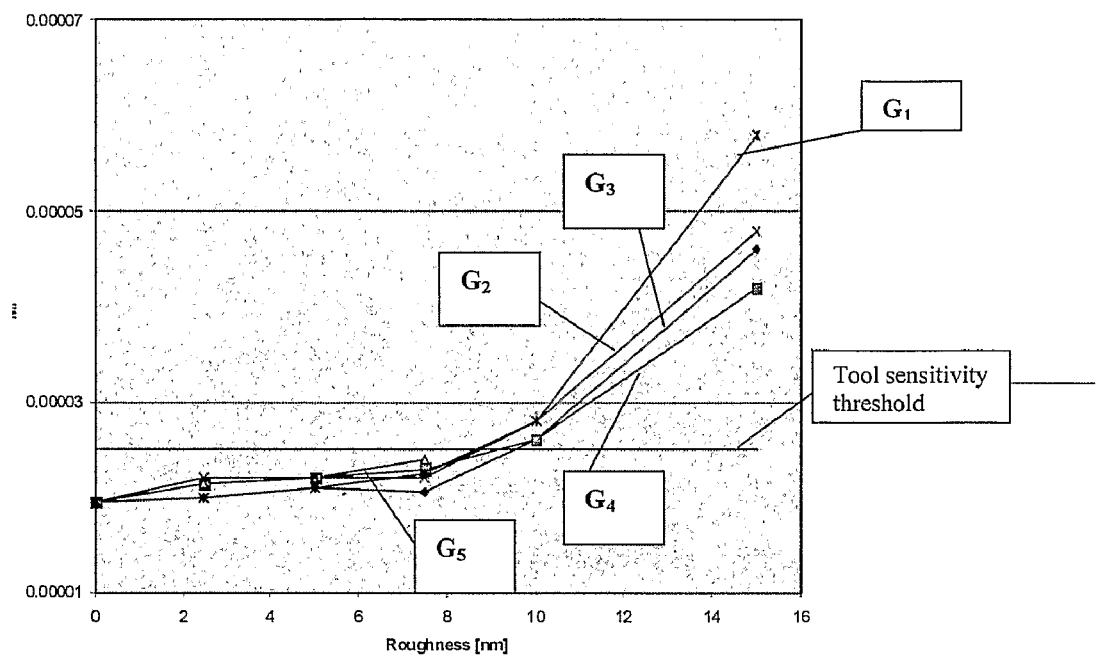
FIG. 11 illustrates measurement results for MF vs LER on a plurality of structures with different LERs.

The measurements on the NovaScan 3090 tool were done by using an effective medium approximation (EMA) based model for the spacers. Pre-modeling steps included careful material characterization and preparation of the photoresist/ air EMA model; subsequently measurements were performed on all the LER structures. Typical results for several sites are seen in FIG. 11. Best MF achieved for a few cases: high frequency (HF), low frequency (LF), in phase and out of phase, and random edge. More specifically, graphs G1-G5 correspond to, respectively, best MF, random condition; best MF, LF, out of phase; best MF, HP, in phase; best MF, HP, out phase; and best MF, LF, in phase. The results of this figure indicate two regions, below and above a critical point, which are common to all cases. At low roughness amplitude the flat curves reflect the fact that roughness is a very weak parameter which does not affect the level of fit. Higher roughness results show a clear increase of the MF with the roughness level, thus indicating the limitations of the model in dealing with the roughness. The transition from the first region to the second region is at around 7-10 nm LER. This transition point reflects the measurement tool capabilities to accurately model and fit such random phenomena in these conditions. The horizontal line that is plotted in FIG. 11, signifying the tool basic long term dynamic noise level, therefore indicates a logical threshold to reliably measure the LER.

Analysis of FIG. 11 show that behavior of the curves is similar in nature for all the synthetic shapes that are involved: high frequency, low frequency, in phase, out of phase, and random. Also, the change of the level of fit (MF) is close to a parabolic function of LER values. There is the crossing point between tool sensitivity threshold and the best MF curve for the different levels of LER. This "critical point" can be considered as the tool capability threshold.

In order to understand the data and predict the performance of the OCD measurement tool, a special dissector was built on the scatterometry modeling software, e.g. NovaMARS commercially available from Nova Measuring Instruments Ltd. The modeling options of this software enable simulation of roughness as sinusoidal oscillations and as pseudo-random fluctuations. Both frequency and amplitude levels can be controlled, and the control of the random seed generation allows testing the assumption of randomness. This degree of freedom allows comparison of the measurement results behavior with the theoretical analysis.

Figure 12:
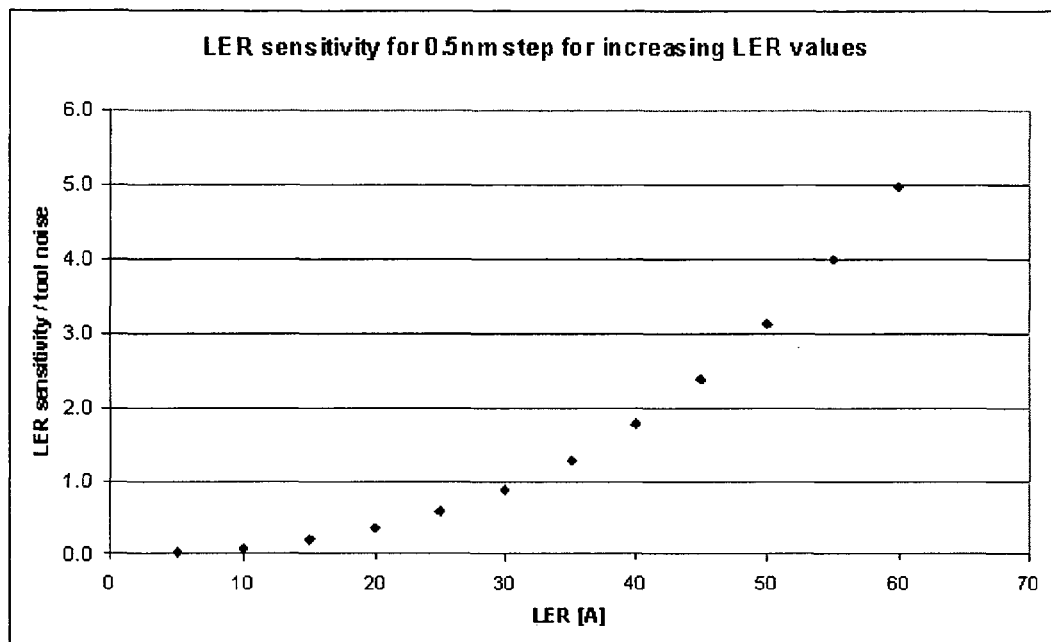
FIG. 12 shows simulation analysis of the sensitivity of LER at different levels of pseudo-random LER.
Figure 12:
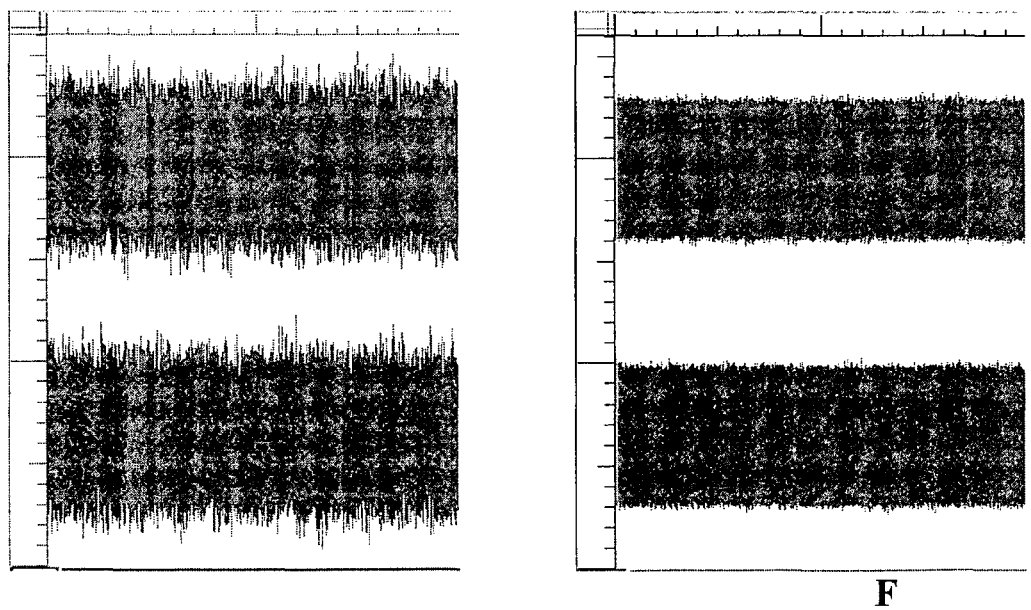

As mentioned above, the sensitivity of LER can be a predictor for the influence of this specific parameter on the model. FIG. 12 shows simulation analysis of the sensitivity of LER in different levels of LER. The results were obtained for polarized light at 250-950 nm for 65 nm equal line to space ratio. It is seen that a parabolic increase in the sensitivity is exhibited, similar to the fit level achieved in FIG. 11. Hence, the measurement capability correlates with LER sensitivity. FIG. 12 has a simple meaning: while small LER changes at low levels of roughness do not cause a measurable spectral change, the same small LER change may cause a larger spectral change at higher roughness values. This was found to be true also at other periods and densities. In this connection, such options as increase of the synthetic roughness and increase of the random roughness could be considered.

With regard to increase of the synthetic roughness, the inventors have modeled the synthetic roughness creation to determine the synthetic roughness ranges that could improve the spectral sensitivity to roughness variation. Turning back to FIG. 4, data indicative of synthetic roughness can be predetermined, at least partially, during the investigation and preparation mode and/or calibration mode, and then used for the preparation of actual test structures. It should also be noted that for some application (e.g. those that do not require very high precision of the parameter measurements), the so-predetermined synthetic roughness can be directly used for the calibration data creation (i.e. without previous creation and measurements on calibration test structures).

Figure 13:
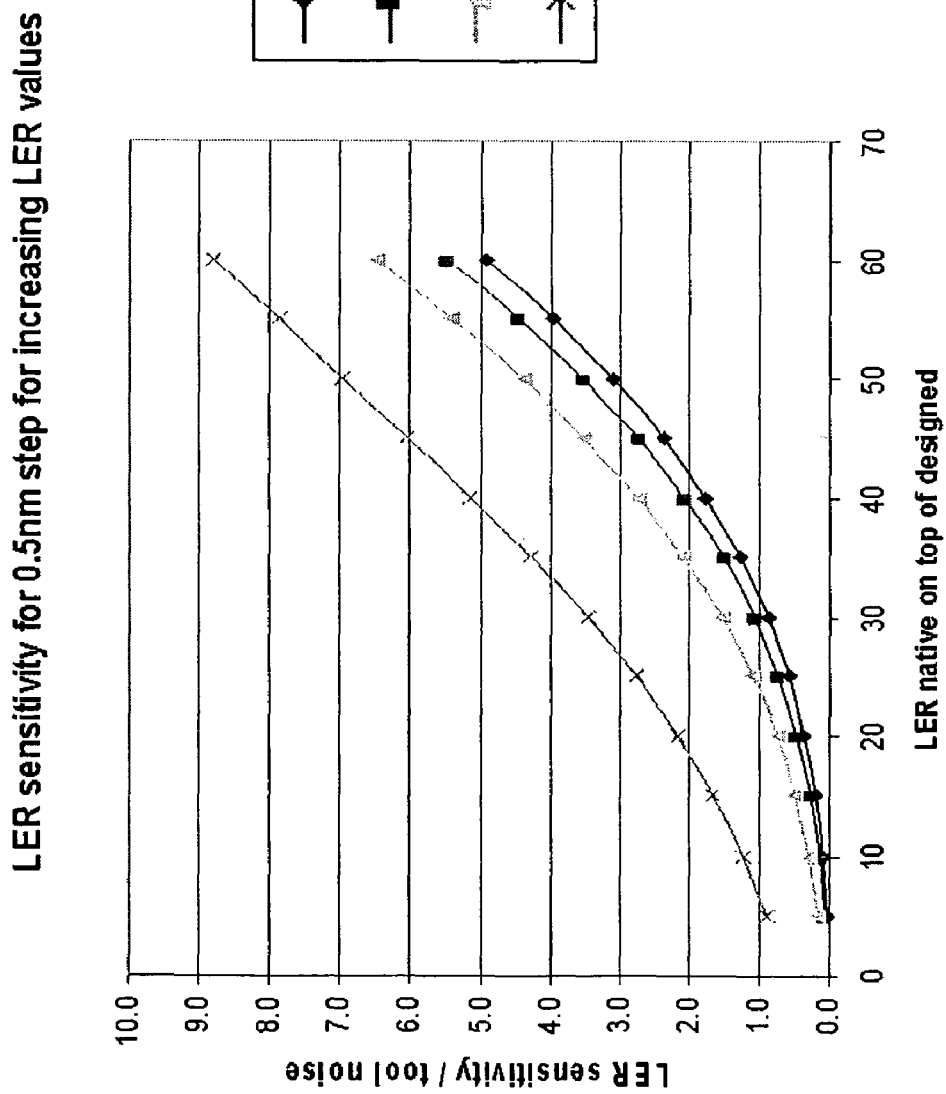
FIG. 13 shows curves for sensitivity to LER of FIG. 12 repeated under four different conditions: 1 nm sinusoidal LER frequency of square amplitude design of 1 nm amplitude, 6 nm amplitude and 12 nm amplitude, the last one being 3 nm random edge designed fluctuations.

It was observed that the squared shaped design is translated by e-beam exposure and development to sinusoidal-like structures on the actual edge. This phenomenon that designed corners can not be reproduced is well known also for optical projection exposure tools, and it is therefore natural to consider that similar smoothing takes place in the lithography production environment. The use of a synthetic sinusoidal function in the simulations was implemented and it is presented in FIG. 13 showing the curves for sensitivity to LER that were calculated in FIG. 12 and repeated under four different conditions: 1 nm sinusoidal LER length scale of square amplitude design of 1 nm amplitude, 6 nm amplitude and 12 nm amplitude, the last one being 3 nm pseudo-random edge designed fluctuations. The threshold of the critical points (where the tool basic sensitivity intersects the LER sensitivity curves) has shown a shift towards smaller LER values. Hence, by using higher synthetic roughness the limits of LER detection could be pushed to lower LER values and better sensitivity could be achieved.

With regard to increase of the random roughness the following should be noted: A more complex mode in the design of data is the creation of pseudo-random edge structures. Such structures were implemented and data from FIG. 11 was reviewed. It can be seen that the random LER MF best fit degradation is the steepest of all. Therefore, "pseudo-random roughness" was simulated to be superimposed on top of the "natural roughness" (the LER that exists without any deliberate design). FIG. 13 presents the expected improvement in sensitivity for such a case. In the same manner as in the measured data of FIG. 11, the best sensitivity was achieved for this pseudo-random case.

The present invention provides for improving the sensitivity to measurement of LER with the increase of the absolute magnitude of the roughness. This allows for overcoming limitations of LER modeling by using two basic approaches—full modeling and ignoring LER in the model. According to the full modeling approach, modeling of pseudo-random LER is implemented as part of the scatterometry optical model. In this way the outcome of the measurement will be the value of the LER magnitude itself, as described above. This approach is preferred if LER can be accurately modeled and no significant correlation with other parameters exists. As for ignoring LER in the model, in this case the modeling work is simplified. This option of MF redundancy, which results in steeper MF growth, will work best when the effects of LER are orthogonal to all other parameters involved in the model. Any approach that is a hybridization between these two is possible. The inventors used the EMA model which is a typical case for such hybridization. The hybridization means the selection of a better model (instead of ignoring LER) but not the exact one. The prerequisite for the solution is sufficient spectral sensitivity to the LER changes. An orthogonality check was performed for the specific cases and it was found to be sufficient for the purposes of the present invention.

Also, the invention allows for overcoming low sensitivity. To enhance sensitivity, the inventors used a special test site that amplifies the roughness via gradual steps of synthetic roughness on a series of targets. The goal of these steps is to create a "calibration curve" for total LER—see FIG. 2. The calibration curve is prepared by measuring each of the sites that has known increments in LER and recording the best MF. This calibration curve can be used with either one of the above-described modeling approaches: direct fit of LER value for the full modeling case or in case of a simplified LER model a change in MF best fit. Based on such a "calibration curve", any change in the LER on the target can be detected. It is preferable to use two measurements or more: one measurement in which the total LER (synthetic plus natural) is below the sensitivity threshold, and a second one well above the threshold. In this way the calibration curve is valid (e.g. valid base line) and not influenced by other non-modeled parameters (FIG. 6).

For process control, the simple CD scatterometry model can be applied to a site containing a line space measurement pad and measured with standard modeling, preferably near the special test site. In this case, simple CD scatterometry model without any change will be applied to nearby sites with increasing synthetic LER. This will cause a deviation in MF for the sites that have increased synthetic LER. Comparison of the MF of the measurement to the calibration curve can be very useful for implementing process alarm on a wafer-to-wafer or lot-to-lot basis (FIG. 6).

The following is an example of the present invention utilizing measurement of a another weak parameter that is not included in the model, namely fixed line-width.

Due to the much larger signal effect of other parameters, the line-width parameter might be difficult to measure. According to an embodiment of the invention, a series of structures (patterned regions or sites) of varying line-width is designed around the nominal width. The structure is modeled with the line-width included but at a fixed value. Performing measurement of these structures with this model, and plotting the MF as a function of designed line-width, would result in a parabola-like change in the MF with a minimum near the nominal value. The location of the parabola minimum in the line-width parameter axis can be found with an enhanced sensitivity relative to the capability of a single-measurement based analysis, which includes the line-width parameter as a modeled parameter. Any shift in the actual value of the line-width will cause a shift in the location of the minimum, which can be characterized.

Figure 14:
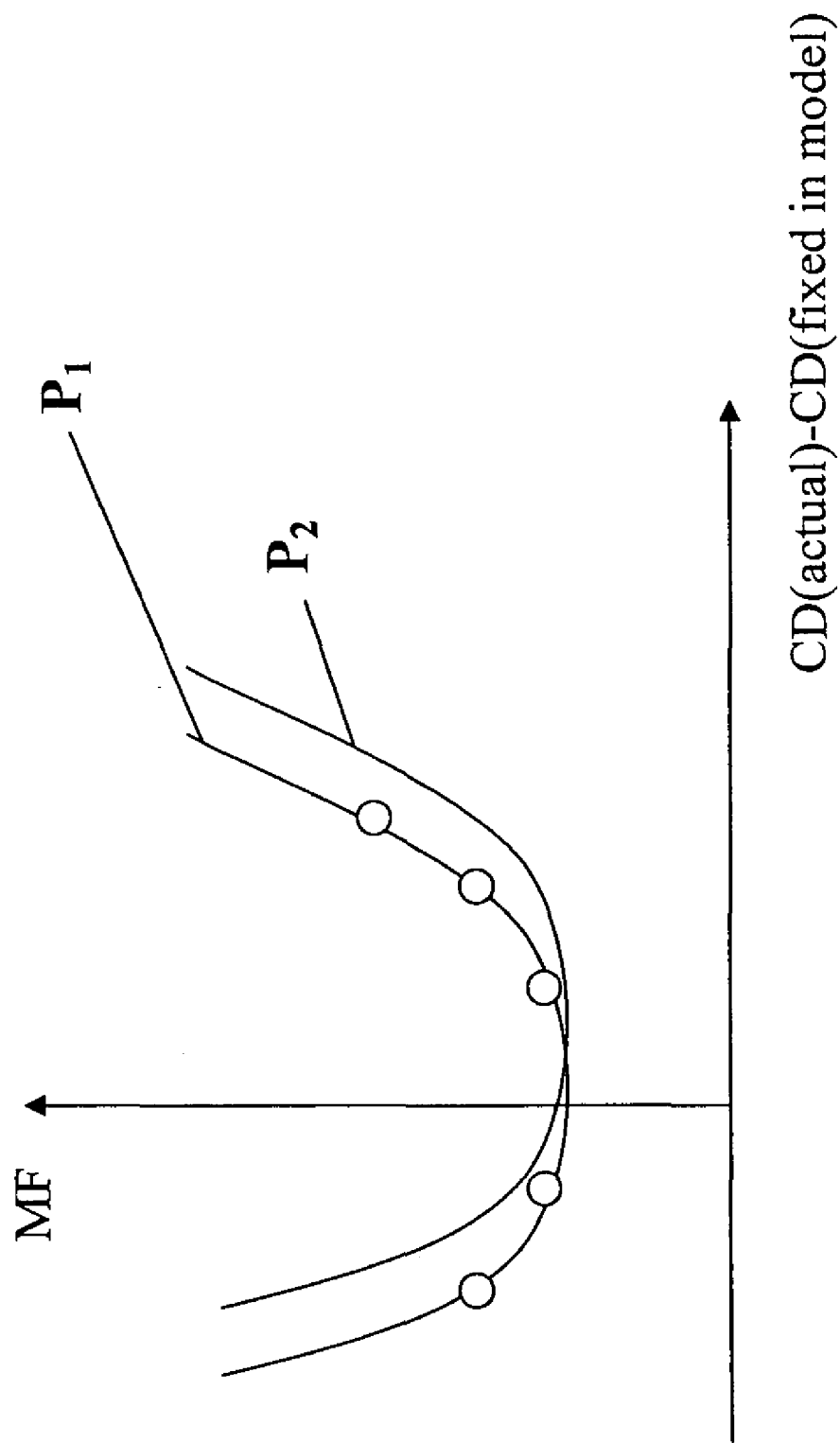
FIG. 14 shows the experimental results of using the technique of the present invention for controlling the line width parameter: the change in MF achieved by best fit for the actual difference between nominal fixed parameter in the line width (CD) and the actual CD that was on the test sites.

In this connection, reference is made to FIG. 14, showing the change in MF achieved by best fit for the actual difference between nominal fixed parameter in the line width (CD) and the actual CD that was on the test sites. Curve P1 corresponds to the calibration of the process; curve P2 corresponds to the same curve achieved on the same test sites but for process shift.

Variations of other un-modeled parameters and fixed parameters or changes in the measurement tool accuracy will cause an essentially regular change in the MF for all test sites, thereby leaving the location of the minimum unchanged. The designed step changes of the line-width versus the nominal value are defined based on characterization of the repeatability of the MF, taking into account the required sensitivity sought for the line-width. The lateral shift in the parabolic shape in FIG. 14 is attributed to the change in the critical dimensions (CD's) towards the situation of the calibration curve that was done in the well centered nominal CD.

Similar to LER-based measurements, the line width measurements may utilize additional optical model considerations, for example techniques that rely on MF sensitivity to the un-modeled parameter should be secured by additional verifications. These include minimum sensitivity for the specific un-modeled parameter that is to be measured (line-width in this example), which sensitivity requirements can be satisfied by choosing large enough steps of the line-width; correlation analysis for model parameters to ensure maximum independence of the specific un-modeled parameter from the variable modeled parameters and the fixed parameters, which can be ensured if all the modeled parameters are uncorrelated to the un-modeled parameter; and including all possible varying parameters in the model except for the specific un-modeled parameters.

This parabolic effect in MF (FIG. 14) can also be utilized to characterize relative lateral shifts between sets of inter-digitated parallel lines, such as in the case of double patterning applications where odd and even lines are formed by different aspects of the process. In the optical model, the lines can be considered as evenly spaced and any shifts on the measured sample will induce a rise in the MF value. A series of targets with varying intentional shifts can be used to produce the calibration curve in this case.

A number of embodiments have been described. Nevertheless, it will be understood that various modifications may be made without departing from the spirit and scope of the disclosure. Accordingly, other embodiments are within the scope of the following claims.

The invention claimed is:

1. A method for use in controlling at least one parameter of a patterned structure characterizing a patterning process applied to the structure, the method comprising:
   (i) providing calibration data indicative of a merit function characterizing optical measurements in a patterned structure as a function of values of a certain parameter of the pattern including at least one value of the merit function below a certain threshold and at least one value of the merit function above said certain threshold;
   (ii) applying the optical measurements to at least one test patterned structure and determining a merit function, wherein the test patterned structure is characterized by a value of said certain parameter of the pattern intentionally increased by a predetermined value above a natural value of said certain parameter induced by a patterning process by which said pattern is produced on the test patterned structure;
   (iii) analyzing the determined merit function and the calibration data and determining said natural parameter value.

2. The method of claim 1, wherein said at least one certain parameter comprises at least one of a line edge roughness and a line width.

3. The method of claim 1, wherein said providing of the calibration data comprises:
   preparing at least one calibration test structure characterized by a value of said certain parameter of the pattern intentionally increased by a predetermined value above a natural value of said certain parameter induced by a patterning process by which said pattern in the calibration test structure is produced;
   applying an engineering measurement tool to said at least one calibration test structure and measuring said certain parameter;
   applying said optical measurements to said at least one calibration test structure, determining the merit function, and determining the calibration data in the form of the merit function and corresponding values of the measured parameter.

4. The method of claim 3, wherein said engineering tool comprises at least one of scanning electron microscope and atomic force microscope.

5. The method of claim 3, wherein said optical measurements comprise optical critical dimension (OCD) measurements.

6. The method of claim 3, wherein the OCD measurement comprises at least one of normal incidence scatterometry, polarized normal incidence scatterometry.

7. The method of claim 3, wherein said providing of the calibration data comprises preparing a plurality of the calibration test structures comprising at least two calibration test structures differing from one another in said intentionally increased value of the certain parameter.

8. The method of claim 7, wherein said plurality of the calibration test structures comprises a calibration test structure with no intentional increase of said certain parameter.

9. The method of claim 3, wherein the preparation of the at least one calibration test structure comprises modeling an effect of the intentional increase of the certain pattern parameter and estimating an optimal range for said values of the intentional increase of the certain parameter.

10. The method of claim 9, wherein said certain parameter used for modeling is a randomly varying line edge roughness.

11. The method of claim 1, wherein an effect of said certain parameter onto the merit function is substantially orthogonal to effects of all other parameters of the structure onto the merit function.

12. The method of claim 1, wherein said certain parameter is a fixed parameter for an optical model used for determination of the merit function.

13. The method of claim 1, comprising applying the optical measurements to a patterned area in a sample to be controlled and determining a merit function corresponding to a natural value of said certain parameter of the pattern resulting form the patterning process applied to the patterned area.

14. A method for use in controlling a patterning process applied to a sample to create a patterned structure, the method comprising:

(i) providing calibration data indicative of a merit function characterizing optical measurements in a patterned structure as a function of values of a certain parameter of the pattern including at least one value of the merit function below a certain threshold and at least one value of the merit function above said certain threshold;

(ii) applying the optical measurements to at least one test patterned structure and determining a merit function, wherein the test patterned structure is characterized by a value of said certain parameter of the pattern intentionally increased by a predetermined value above a natural value of said certain parameter induced by a patterning process by which said pattern is produced on the test patterned structure;

(iii) analyzing the determined merit function and the calibration data and determining said natural parameter value.

15. A method for use in controlling a patterning process applied to a sample to create a patterned structure, the method comprising:

(i) providing calibration data indicative of a merit function characterizing optical measurements in a patterned structure as a function of values of a line edge roughness including at least one value of the merit function below a certain threshold and at least one value of the merit function above said certain threshold;

(ii) applying the optical measurements to at least one test patterned structure and determining a merit function, wherein the test patterned structure is characterized by a value of said line edge roughness intentionally increased by a predetermined value above a natural value of said line edge roughness induced by the patterning process;

(iii) analyzing the determined merit function and the calibration data and determining said natural value of the line edge roughness.

* * * * *